(12) United States Patent
Chen et al.

(10) Patent No.: US 9,373,768 B2
(45) Date of Patent: Jun. 21, 2016

(54) FLIP-CHIP LIGHT-EMITTING DIODE UNIT

(71) Applicant: Genesis Photonics Inc., Tainan (TW)

(72) Inventors: Cheng-Yen Chen, Tainan (TW); Sie-Jhan Wu, Tainan (TW); Po-Jen Su, Tainan (TW)

(73) Assignee: Genesis Photonics Inc., Tainan (TW)

( * ) Notice: Subject to any disclaimer, the term of this patent is extended or adjusted under 35 U.S.C. 154(b) by 0 days.

(21) Appl. No.: 14/280,190

(22) Filed: May 16, 2014

(65) Prior Publication Data

US 2014/0339576 A1 Nov. 20, 2014

(30) Foreign Application Priority Data

May 17, 2013 (TW) .............................. 102209261 U (51) Int. Cl.
*H01L 33/00* (2010.01)
*H01L 33/62* (2010.01)
*H01L 25/075* (2006.01)
*H01L 33/38* (2010.01)
*F21K 99/00* (2016.01)
*H01L 33/36* (2010.01)

(52) U.S. Cl.
CPC . *H01L 33/62* (2013.01); *F21K 9/00* (2013.01); *H01L 25/0753* (2013.01); *H01L 33/38* (2013.01); *H01L 33/36* (2013.01); *H01L 2924/0002* (2013.01); *H01L 2933/0016* (2013.01)

(58) Field of Classification Search
CPC ....... H01L 33/36; H01L 33/38; H01L 33/382; H01L 33/385; H01L 33/483; H01L 33/486; H01L 33/62; H01L 25/0753; H01L 2933/0016; F21K 9/00
See application file for complete search history.

(56) References Cited

U.S. PATENT DOCUMENTS

| | | | |
|---|---|---|---|
| 2012/0193649 A1* | 8/2012 | Donofrio et al. ................. | 257/88 |
| 2012/0306351 A1* | 12/2012 | Wilcox ................. | G09F 19/228 |
| | | | 313/498 |

* cited by examiner

*Primary Examiner* — Su C Kim
(74) *Attorney, Agent, or Firm* — Jianq Chyun IP Office (57) ABSTRACT

A flip-chip light-emitting diode (LED) unit includes a substrate, an electrode pad set disposed on the substrate, and three flip-chip LEDs disposed on the electrode pad set in a flip-chip manner and including one first LED and two second LEDs that are spaced apart from the first LED and that are electrically coupled to the first LED in a series configuration.

4 Claims, 9 Drawing Sheets

FLIP-CHIP LIGHT-EMITTING DIODE UNIT

CROSS-REFERENCE TO RELATED APPLICATION

This application claims priority of Taiwanese Patent Application No. 102209261, filed on May 17, 2013.

BACKGROUND OF THE INVENTION

1. Field of the Invention

The invention relates to a light-emitting diode (LED) unit, more particularly to a flip-chip LED unit capable of producing uniform brightness.

2. Description of the Related Art

Recently, conventional light bulbs have been widely replaced by LED lighting devices in various fields due to their advantages such as low power consumption, long lifespan, etc. Conventionally, LEDs are attached to a substrate of a LED lighting unit using silver adhesives. However, the silver adhesives have relatively low thermal conductivities and low die-bonding strengths, resulting in a relatively low reliability of the LED lighting unit. Therefore, flip-chip packaging technology is adopted for the LED lighting units in order to alleviate the aforesaid shortcomings.

Nonetheless, another flaw of the conventional LED lighting unit resides in that LEDs mainly serve as point light sources due to their sizes. That is, while being applied into certain lighting devices, such as a commercial light box, poor lighting uniformity may be arise. One suggested solution is to increase the number of LEDs in the LED lighting unit for enhancing the lighting uniformity, but such approach may result in operational instability and input power losses that leads to an inefficient conversion into light energy.

SUMMARY OF THE INVENTION

Therefore, the object of the present invention is to provide a flip-chip LED unit that may alleviate the aforementioned drawbacks of the prior art.

Accordingly, a flip-chip LED unit of the present invention includes a substrate, an electrode pad set, and three LEDs. The three LEDs are disposed on the substrate in a flip-chip manner and include one first LED and two second LEDs. The second LEDs are spaced apart from the first LED and are electrically coupled to the first LED in a series configuration.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

Before the present invention is described in greater detail, it should be noted that like elements are denoted by the same reference numerals throughout the disclosure.

Figure 1:
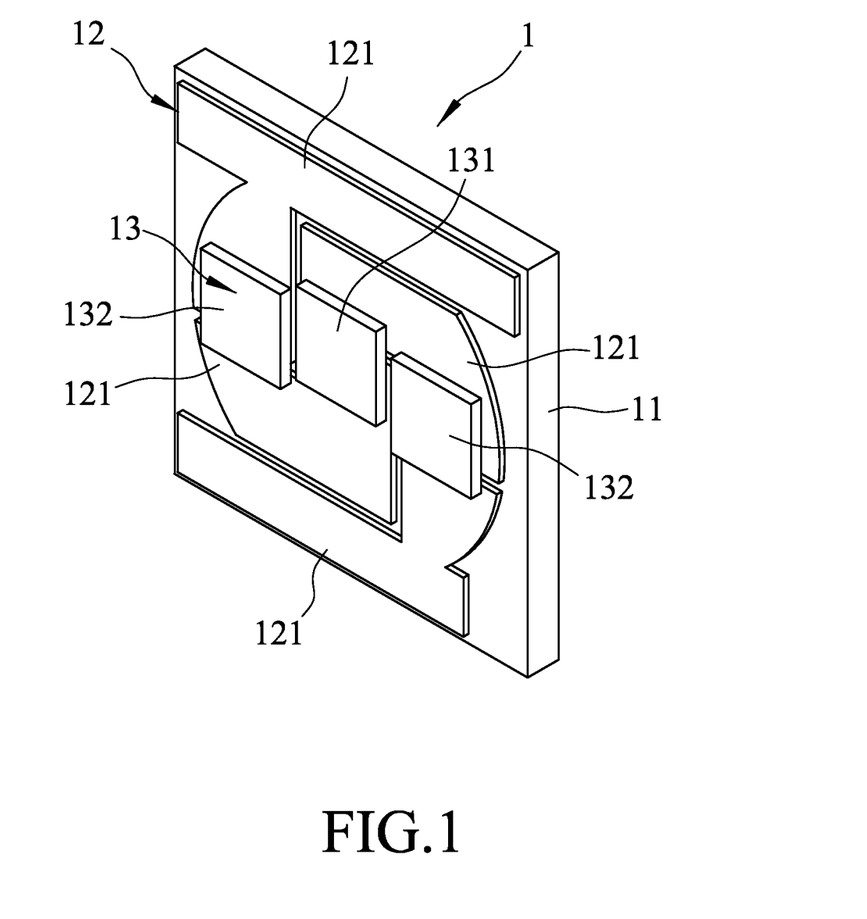
FIG. 1 is a perspective view of a first preferred embodiment of a flip-chip LED unit according to the invention.
Figure 2:
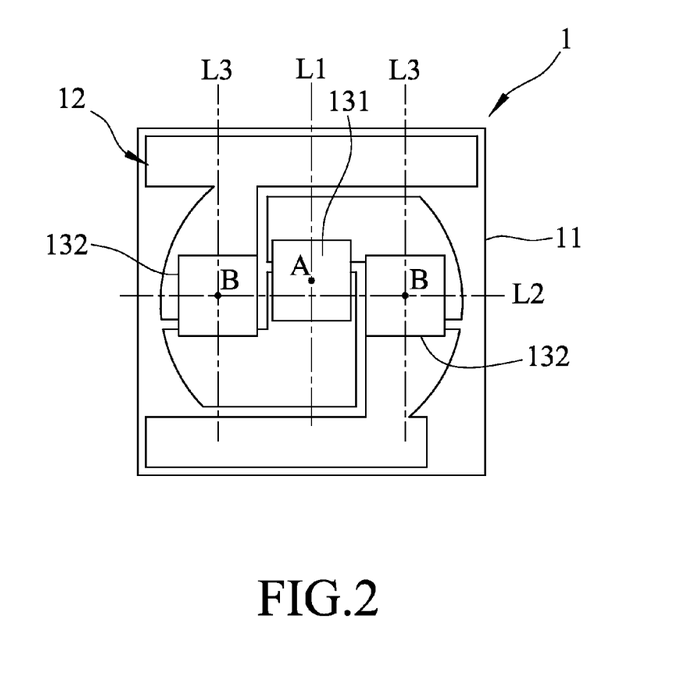
FIG. 2 is a schematic view of the first preferred embodiment.
Figure 3:
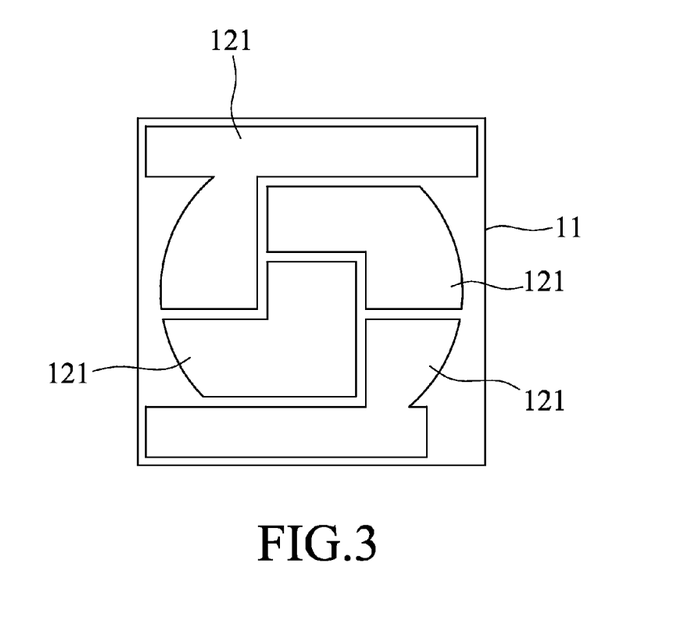
FIG. 3 is a schematic view illustrating an electrode pad set of the flip-chip LED unit of the first preferred embodiment.

Referring to FIGS. 1 to 3, the first preferred embodiment of a flip-chip LED unit 1 according to the present invention is shown to include a substrate 11, an electrode pad set 12 disposed on the substrate 11, and a flip-chip LED set 13 disposed on the electrode pad set 12 in a flip-chip manner.

The electrode pad set 12 includes four spaced-apart electrode pads 121. The flip-chip LED set 13 has three LEDs, including one first LED 131 and two second LEDs 132 that are spaced apart from each other and from the first LED 131, and that are electrically coupled to the first LED 131 in a series fashion. In this embodiment, the first and second LEDs 131, 132 are eutectic-bonded to the electrode pad set 12. To be specific, each of the first and second LEDs 131, 132 has a cathode and an anode, and the cathode and the anode of each of the first and second LEDs 131, 132 are eutectic-bonded to an adjacent pair of the electrode pads 121, respectively, so that the first and second LEDs 131, 132 are formed into a serial circuit path. Such eutectic bonding provides a relatively high heat-dissipating efficiency as well as an enhanced die-bonding strength for the first and second LEDs 131, 132, so that a relatively high reliability of the flip-chip LED unit 1 may be attained. It should be noted that, as shown in FIG. 3, the layout of the electrode pads 121 needs to satisfy the serial configuration of the first and second LEDs 131, 132.

In this embodiment, the first LED 131 has a first geometric center (A) and a first symmetry axis (L1) passing through the first geometric center (A). Each of the second LEDs 132 has a second geometric center (B), a first symmetry axis (L3) and a second symmetry axis (L2). The first and second symmetry axes (L3, L2) of each of the second LEDs 132 intersect perpendicularly each other at the second geometric center (B) of a respective one of the second LEDs 132. In this embodiment, the first and second LEDs 131, 132 are configured in a rectangular shape, and each of the first and second symmetry axes (L3, L2) passes through mid points of two opposite sides of the respective one of the second LEDs 132. In this embodiment, the first geometric center (A) of the first LED 131 is out of alignment with a line that interconnects the second geometric centers (B) of the second LEDs 132. In addition, the second geometric centers (B) of the second LEDs 132 are disposed on two opposite sides of the first symmetry axis (L1) and are equal in distance from any point on the first symmetry axis (L1). That is, the second LEDs 132 are symmetric relative to the first symmetry axis (L1) of the first LED 131. Further, the first symmetry axes (L3) of the second LEDs 132 are parallel to the first symmetry axis (L1) of the first LED 131, and the second symmetry axes (L2) of the second LEDs 132 pass through the first LED 131. By such arrangement of the first and second LEDs 131, 132, the flip-chip LED unit 1 of the present invention can achieve a relatively high lighting uniformity and is suitable for devices which need to provide large-scale lighting areas, such as commercial lightboxes.

It should be noted that the first geometric center (A) of the first LED 131 may be in line with the second geometric centers (B) of the second LEDs 132 in other embodiments of this invention and the configuration of the first and second LEDs 131, 132 is not limited to what is disclosed in this preferred embodiment.

It should be also noted that, if an input power for each of the first and second LEDs 131, 132 is too low, an insufficient illumination may occur. On the other hand, if the input power for each of the first and second LEDs 131, 132 is too high, energy is wasted. Therefore, in this embodiment, each of the first and second LEDs 131, 132 is designed to have a voltage rating of about 3 Volts and a power rating of about 1 Watt, so that the flip-chip LED unit 1 of this embodiment has a voltage rating of about 9 Volts and an overall power rating of about 3 Watts. An optimum operating wattage can thus be obtained.

The flip-chip LED unit 1 according to the present invention has the following advantages:

(1) The first and second LEDs 131, 132 with the staggered arrangement as shown in FIG. 2 may be used as a surface light source and are able to provide uniform surface brightness. The flip-chip LED unit 1 does not have strong directionality, which may lead to unidirectional concentration of light.

(2) The first and second LEDs 131, 132 each having 1 watt are interconnected in series to produce a voltage rating of 9 volts and a power rating of 3 watts, thereby providing the flip-chip LED unit 1 with optimum power rating, which is suitable for a lightbox with a large light-exiting surface area.

(3) The eutectic bonding of the first and second LEDs 131, 132 to the electrode pads 121 increases heat-dissipation, die-bonding strength and operational stability.

Figure 4:
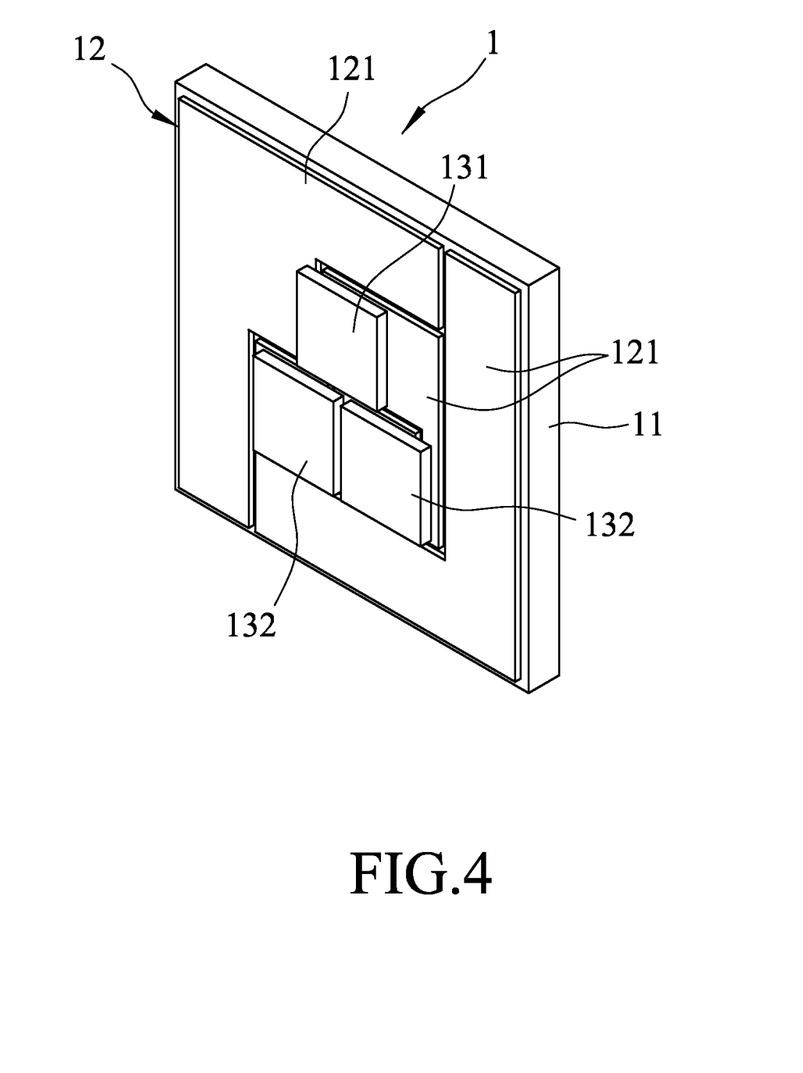
FIG. 4 is a perspective view of a second preferred embodiment of the flip-chip LED unit according to the present invention.
Figure 5:
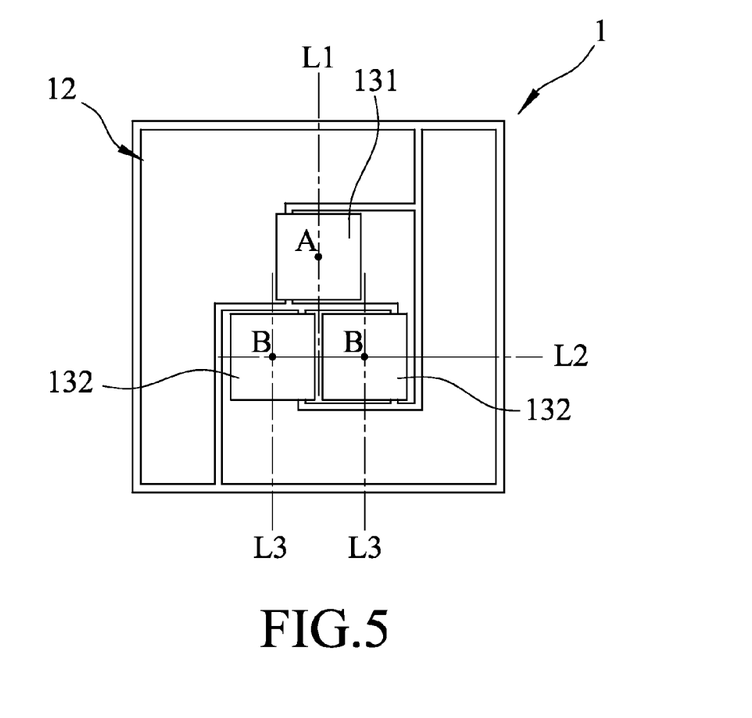
FIG. 5 is a schematic view of the second preferred embodiment.
Figure 6:
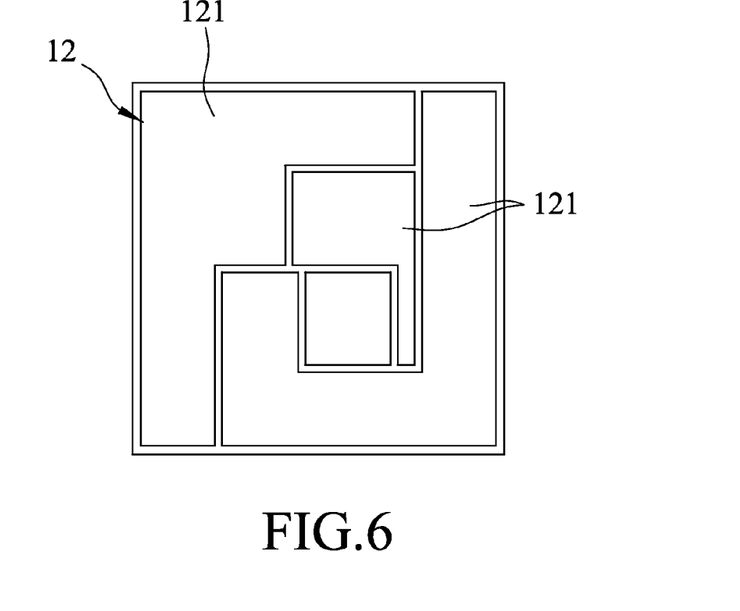
FIG. 6 is a schematic view illustrating the electrode pad set of the flip-chip LED unit of the second preferred embodiment.

Referring to FIGS. 4 to 6, the second preferred embodiment of the flip-chip LED unit 1 according to the present invention is shown to be similar to that of the first preferred embodiment. The difference therebetween resides in that none of the second symmetry axes (L2) of the second LEDs 132 passes through the first LED 131. That is, the first and second LEDs 131, 132 have a greater staggered configuration. In addition, the shapes and arrangement of the electrode pads 121 of the second preferred embodiment are altered to accommodate the arrangement of the first and second LEDs 131, 132. The second preferred embodiment has the same advantages as the first preferred embodiment.

Figure 7:
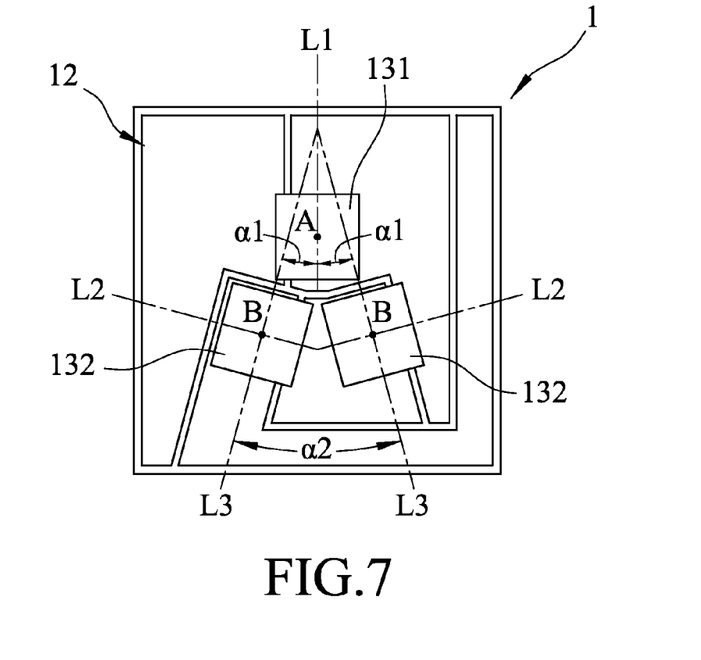
FIG. 7 is a schematic view of a third preferred embodiment of the flip-chip LED unit according to the present invention.
Figure 8:
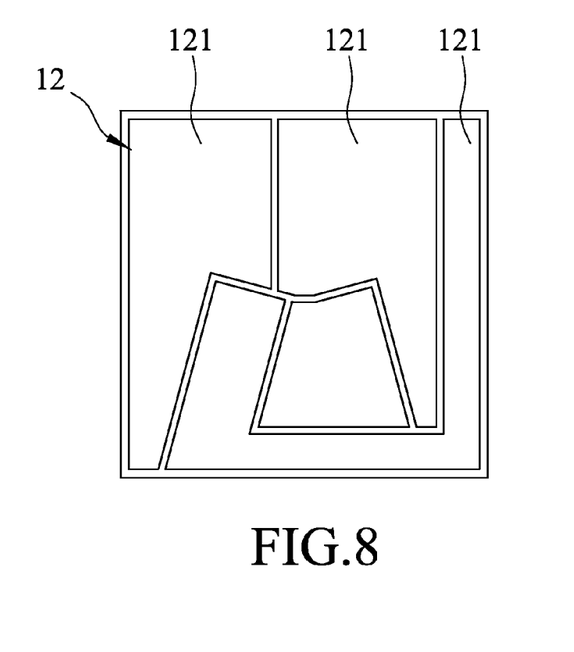
FIG. 8 is a schematic view illustrating the electrode pad set of the flip-chip LED unit of the third preferred embodiment.
Figure 9:
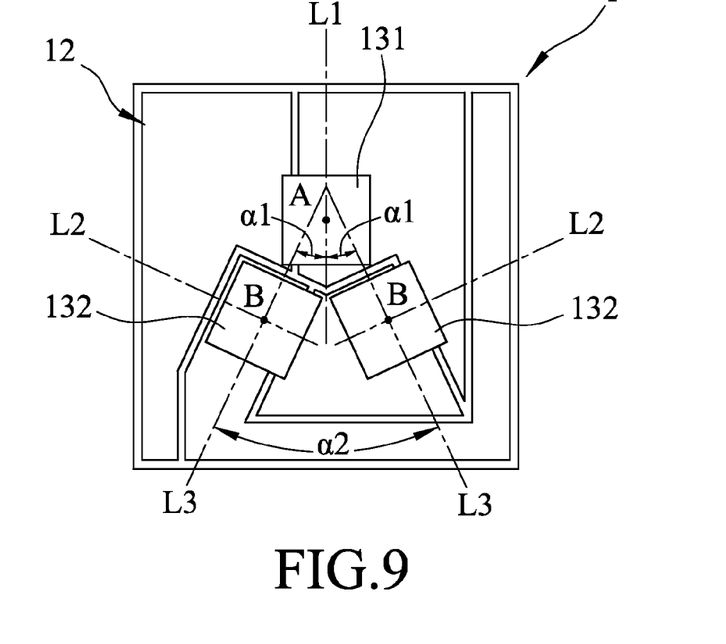
FIG. 9 is a schematic view showing a variation of the third preferred embodiment.
Figure 10:
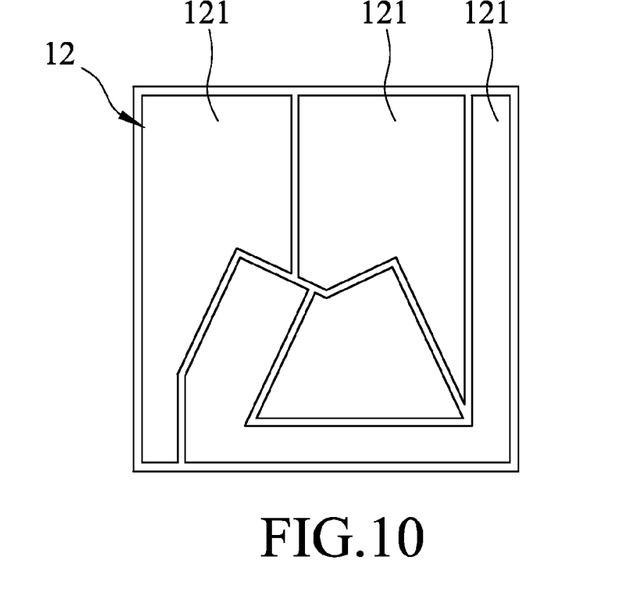
FIG. 10 is a schematic view illustrating the electrode pad set of the variation of the third preferred embodiment shown in FIG. 9.
Figure 11:
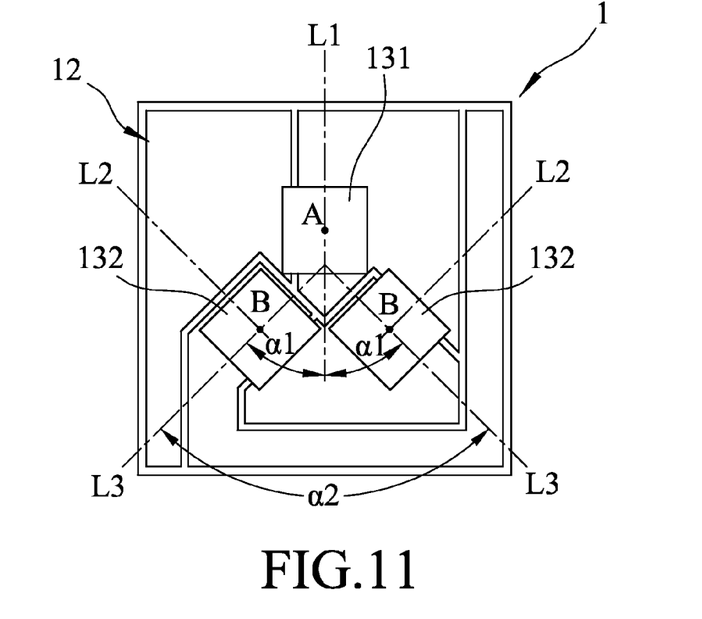
FIG. 11 is a schematic view of another variation of the third preferred embodiment.
Figure 12:
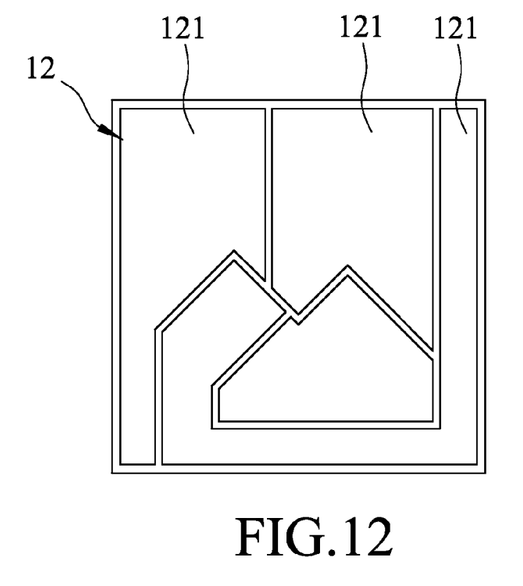
FIG. 12 is a schematic view illustrating the electrode pad set of the variation of the third preferred embodiment shown in FIG. 11.
Figure 13:
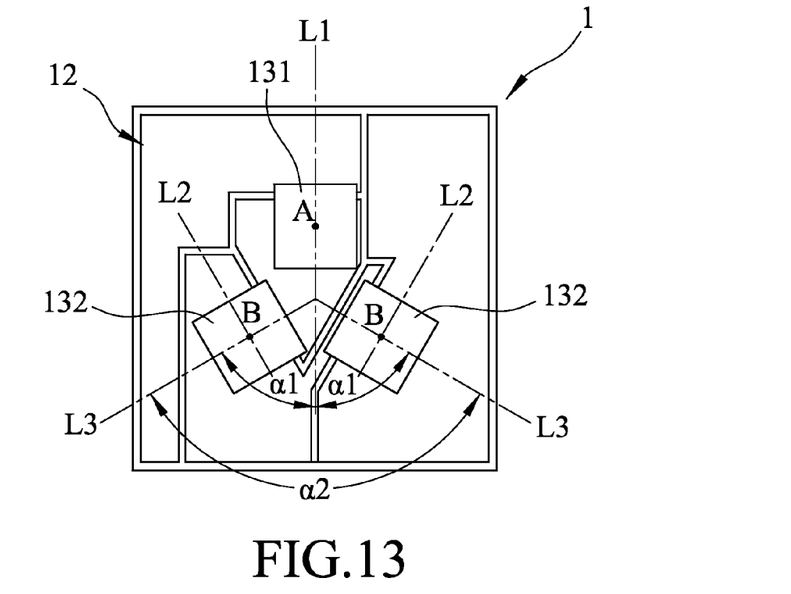
FIG. 13 is a schematic view of yet another variation of the third preferred embodiment.
Figure 14:
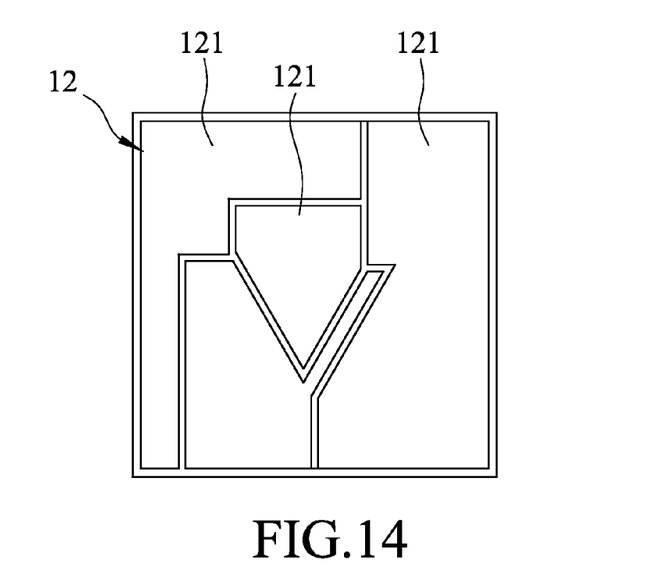
FIG. 14 is a schematic view illustrating the electrode pad set of the variation of the third preferred embodiment shown in FIG. 13.
Figure 15:
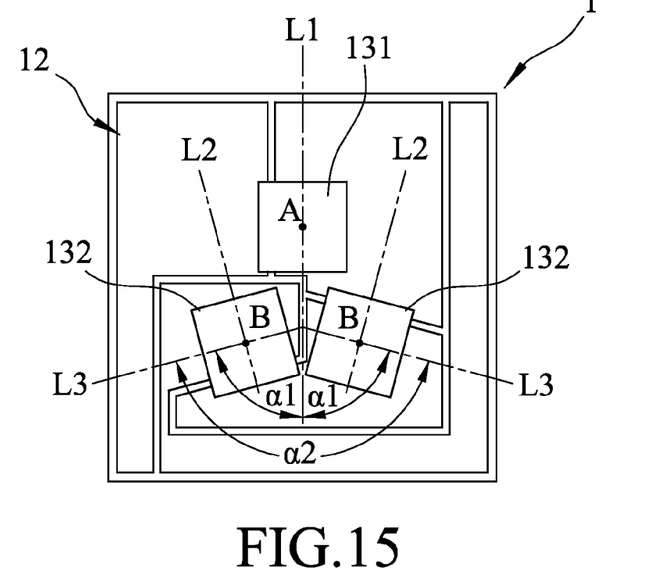
FIG. 15 is a schematic view of yet another variation of the third preferred embodiment.
Figure 16:
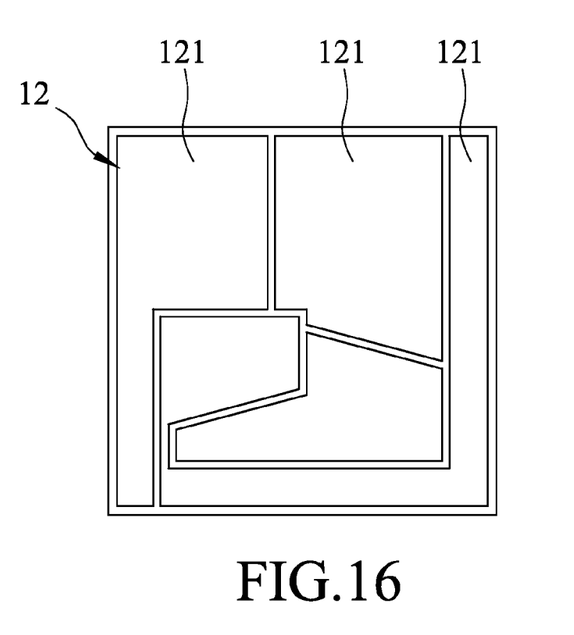
FIG. 16 is a schematic view illustrating the electrode pad set of the variation of the third embodiment shown in FIG. 15.

Referring to FIGS. 7 and 8, the third preferred embodiment of the flip-chip LED unit 1 according to the present invention is shown to be similar to that of the second preferred embodiment. The difference therebetween resides in that none of the first and second symmetry axes (L3, L2) of the second LEDs 132 is parallel to the first symmetry axis (L1) of the first LED 131. That is to say, in this embodiment, each of the second LEDs 132 is rotated about the respective one of the second geometric centers (B), and the first symmetry axis (L3) of each of the second LEDs 132 forms a first acute included angle ($\alpha 1$) with the first symmetry axis (L1) of the first LED 131. In addition, a second included angle ($\alpha 2$) is formed by intersection of the first symmetry axes (L3) of the two second LEDs 132 and is equal to a sum of the first included angles ($\alpha 1$) of the first symmetry axes (L1, L3) of the first and second LEDs 131, 132. Preferably, the first included angles ($\alpha 1$) are identical, indicating that the second LEDs 132 are symmetric relative to the first symmetry axis (L1) of the first LED 131. In this embodiment, the first included angles ($\alpha 1$) of the first symmetry axes (L1,L3) of the first and second LEDs 131, 132 are 15° (which is less than 90°), and the second included angle of the first symmetry axes (L3) of the second LEDs 132 is 30°. The third embodiment has the same advantages as the first preferred embodiment.

It is worth noting that the first included angle ($\alpha 1$) of the flip-chip LED unit 1 may vary based on actual demands. Referring to FIGS. 9, 11, 13, and 15, variations of the third preferred embodiment of the flip-chip LED unit 1 are shown to have various first included angles ($\alpha 1$), which are 25°, 45°, 60°, and 75°, respectively. Accordingly, as shown in FIGS. 10, 12, 14, and 16, the shapes and arrangement of the corresponding electrode pads 121 need to be adjusted based on the configurations of the first and second LEDs 131, 132 as depicted in FIGS. 9, 11, 13, and 15, respectively.

To sum up, by virtue of the configuration and arrangement of the first and second LEDs 131, 132, the flip-chip LED unit 1 according to the present invention is capable of providing a relatively high lighting uniformity while maintaining a relatively low energy consumption rate. Besides, the eutectic bonding of the first and second LEDs 131, 132 provides a relatively high heat-dissipating efficiency as well as an enhanced die-bonding strength for the first and second LEDs 131, 132, so that the flip-chip LED unit 1 of this invention has relatively high reliability.

While the present invention has been described in connection with what are considered the most practical and preferred embodiments, it is understood that this invention is not limited to the disclosed embodiments but is intended to cover various arrangements included within the spirit and scope of the broadest interpretation so as to encompass all such modifications and equivalent arrangements.

What is claimed is:

1. A flip-chip light-emitting diode (LED) unit comprising:
   a substrate;
   an electrode pad set disposed on said substrate; and
   three LEDs disposed on said electrode pad set in a flip-chip manner, and located next to one another, wherein said three LEDs includes one first LED and two second LEDs that are spaced apart from said first LED, and a reference line passing through a first geometric center of said first LED and parallel to an edge of the first LED passes through a gap area separating said two second LEDs,
   wherein each of said second LEDs has a second geometric center, said first geometric center being out of alignment with a line that interconnects said second geometric centers of said second LEDs;
   wherein said first LED further has a first symmetry axis which passes through said first geometric center, said second geometric centers being disposed on two opposite sides of said first symmetry axis;
   wherein said second geometric centers are equal in distance from said first symmetry axis;
   wherein each of said second LEDs has first and second symmetry axes intersecting perpendicularly each other at said second geometric center of a respective one of said second LEDs, none of said first and second symmetry axes of said second LEDs being parallel to said first symmetry axis of said first LED;

wherein none of said second symmetry axes of said second LEDs passes through said first LED;

wherein said first symmetry axis of each of said second LEDs forms a first included angle of less than 90° with said first symmetry axis of said first LED; and wherein said first symmetry axes of said second LEDs form a second included angle that is equal to a sum of said first included angles of said first symmetry axes of said second LEDs.

2. The flip-chip LED unit according to claim 1, wherein said three LEDs have a voltage rating of about 9 Volts and a power rating of about 3 Watts.

3. The flip-chip LED unit according to claim 1, wherein said three LEDs are eutectic-bonded to said electrode pad set.

4. The flip-chip LED unit according to claim 1, wherein said electrode pad set includes four spaced-apart electrode pads disposed on said substrate, each of said first and second LEDs having a cathode and an anode, said cathode and said anode of each of said first and second LEDs being eutectic-bonded to an adjacent pair of said electrode pads, respectively, so that said first and second LEDs and said electrode pads are formed into a series circuit path.

* * * * *